US012683626B2

(12) United States Patent
Lin et al.

(10) Patent No.: US 12,683,626 B2
(45) Date of Patent: Jul. 14, 2026

(54) SAMPLE AND HOLD CIRCUIT AND RELATED DRIVER CIRCUIT

(71) Applicant: NOVATEK Microelectronics Corp., Hsin-Chu (TW)

(72) Inventors: Jin-Yi Lin, Kaohsiung City (TW); Jhih-Siou Cheng, New Taipei City (TW); Yung-Te Chang, Hsinchu County (TW); Chih-Cheng Chen, Yunlin County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 163 days.

(21) Appl. No.: 18/106,470

(22) Filed: Feb. 6, 2023

(65) Prior Publication Data

US 2023/0378972 A1 Nov. 23, 2023

Related U.S. Application Data

(60) Provisional application No. 63/343,546, filed on May 19, 2022.

(51) Int. Cl.
| | |
|---|---|
| *H03M 1/34* | (2006.01) |
| *H03M 1/12* | (2006.01) |
| *H03M 1/14* | (2006.01) |
| *H03M 1/46* | (2006.01) |

(52) U.S. Cl.
CPC ......... *H03M 1/468* (2013.01); *H03M 1/1245* (2013.01); *H03M 1/145* (2013.01); *H03M 1/462* (2013.01)

(58) Field of Classification Search
CPC .... H03M 1/468; H03M 1/462; H03M 1/1245; H03M 1/46; H03M 1/466; H03M 1/804; H03M 1/1215; H03M 1/08; H03M 1/38; H03M 1/145; H03M 1/002; H03M 1/0682; H03M 1/0863; H03M 1/1225; H03M 1/125; H03M 1/0695; H03M 1/1023; H03M 1/12; H03M 1/164; H03M 1/56; H03M 1/68; H03M 1/0626; H03M 1/069; H03M 1/123; H03M 1/124; H03M 3/426; H03M 1/06; H03M 1/0607; H03M 1/0612; H03M 1/068; H03M 1/0697
USPC .................. 341/110, 122, 144, 155, 161, 162
See application file for complete search history.

(56) References Cited

U.S. PATENT DOCUMENTS

| | | | | |
|---|---|---|---|---|
| 6,313,780 B1* | 11/2001 | Hughes | ............... | H03M 1/0682 341/172 |
| 7,126,515 B1* | 10/2006 | Kris | ..................... | H03M 1/1225 341/155 |
| 8,350,740 B2* | 1/2013 | Akita | ..................... | G11C 27/024 341/122 |
| 10,340,938 B1* | 7/2019 | Eitan | ....................... | H03M 1/38 |
| 10,630,310 B1* | 4/2020 | Litjes | .................... | H03M 1/462 |
| 11,108,402 B1* | 8/2021 | Strijker | ............... | H03M 1/0697 |

(Continued)

FOREIGN PATENT DOCUMENTS

| | | |
|---|---|---|
| TW | 202127807 A | 7/2021 |

*Primary Examiner* — Linh V Nguyen
(74) *Attorney, Agent, or Firm* — Winston Hsu

(57) ABSTRACT

A sample and hold (S/H) circuit includes an analog-to-digital converter (ADC), a register and a digital-to-analog converter (DAC). The ADC receives an input signal and converts the input signal into a digital code. The register, coupled to the ADC, stores the digital code. The DAC, coupled to the register, converts the digital code into an output signal.

8 Claims, 13 Drawing Sheets

(56) References Cited

U.S. PATENT DOCUMENTS

| | | | |
|---|---|---|---|
| 11,418,207 B1 * | 8/2022 | Wang ................... | H03M 1/1215 |
| 2003/0160714 A1 * | 8/2003 | Yoshinaga .......... | H03M 1/1023 |
| | | | 341/122 |
| 2003/0174083 A1 * | 9/2003 | Mayfield ............. | H03M 1/1019 |
| | | | 341/166 |
| 2006/0145984 A1 * | 7/2006 | Sun ........................ | H10D 86/40 |
| | | | 345/92 |
| 2007/0279274 A1 * | 12/2007 | Hsieh ................. | H03M 1/1225 |
| | | | 341/155 |
| 2008/0001935 A1 * | 1/2008 | Nurmi .................... | G09G 3/006 |
| | | | 345/204 |
| 2009/0040173 A1 * | 2/2009 | Ezaki .................... | H05B 45/20 |
| | | | 345/102 |
| 2010/0039303 A1 * | 2/2010 | Tsukamoto ......... | H03M 1/1061 |
| | | | 341/172 |
| 2011/0001492 A1 * | 1/2011 | Nys ...................... | H03M 1/123 |
| | | | 324/658 |
| 2011/0102217 A1 * | 5/2011 | Hsu ..................... | H03M 1/1042 |
| | | | 341/120 |
| 2011/0148681 A1 * | 6/2011 | Mao ........................ | H03M 1/66 |
| | | | 341/153 |
| 2013/0033392 A1 * | 2/2013 | Nani ........................ | H03M 1/08 |
| | | | 341/172 |
| 2014/0191889 A1 * | 7/2014 | Haneda ................. | H03M 1/069 |
| | | | 341/118 |
| 2014/0340150 A1 * | 11/2014 | Dempsey ............ | H03F 3/45475 |
| | | | 330/260 |
| 2015/0180496 A1 * | 6/2015 | Drago ..................... | H03M 1/46 |
| | | | 341/122 |
| 2016/0056830 A1 * | 2/2016 | Malik ................. | H03M 1/0612 |
| | | | 341/158 |

* cited by examiner

S_SAMP

S_SAMP1

S_SAMP2

S_SAMP3

S_SAMP4

S_EN1

S_EN2

S_EN3

S_EN4

$I_{IN2}$ $I_{IN3}$ $I_{IN1}$ $I_{IN4}$ $I_{IN}$ $I_{OUT1}$ $I_{OUT2}$ $I_{OUT3}$ $I_{OUT4}$

FIG. 14

SAMPLE AND HOLD CIRCUIT AND RELATED DRIVER CIRCUIT

CROSS REFERENCE TO RELATED APPLICATIONS

This application claims the benefit of U.S. Provisional Application No. 63/343,546, filed on May 19, 2022. The content of the application is incorporated herein by reference.

BACKGROUND OF THE INVENTION

1. Field of the Invention

The present invention relates to a sample and hold (S/H) circuit implemented in a driver circuit, and more particularly, to an S/H circuit implemented in a driver circuit for driving a light-emitting diode (LED) panel.

2. Description of the Prior Art

Mini integrated circuits (mini-ICs) used for driving light-emitting diode (LED) panels are gradually emerging due to their competitive advantages over traditional larger driver ICs. With the smaller size and lower integrity of the mini-IC, the overheating problem may be mitigated, causing that the LEDs on the panel will seldom be influenced by the heating IC. The mini-ICs also have a simpler structure as compared to the traditional high-integrity ICs, and are easy to implement. In general, a mini-IC is configured with 4 output pins to provide 4 output currents for the LEDs, e.g., for 4 columns of LED pixels on the panel. Therefore, a plurality of mini-ICs may be deployed on a substrate, such as a glass substrate or a printed circuit board (PCB), to commonly control an LED panel.

In consideration of the cost issue of the mini-IC, the pin count of the mini-IC should be as few as possible. A conventional mini-IC used to provide 4 output currents may include 4 data input pins, 1 IC enable control pin, 4 channel off pins, 4 current output pins, 2 power supply pins and 3 ground pins, and there are 18 pins in total. The necessary I/O pins and control pins occupy 13 pins, which still have rooms for improvement.

In addition, the mini-IC may use sample and hold (S/H) circuits to sample and amplify input current data to generate output currents to be provided for the LED panel. An S/H circuit that is used to provide the output current usually applies a current mirror to amplify/generate the current.

SUMMARY OF THE INVENTION

It is therefore an objective of the present invention to provide a novel sample and hold (S/H) circuit implemented in a mini integrated circuit (mini-IC) for driving a light-emitting diode (LED) panel.

An embodiment of the present invention discloses an S/H circuit, which comprises an analog-to-digital converter (ADC), a register and a digital-to-analog converter (DAC). The ADC receives an input signal and converts the input signal into a digital code. The register, coupled to the ADC, stores the digital code. The DAC, coupled to the register, converts the digital code into an output signal.

Another embodiment of the present invention discloses a driver circuit, which comprises a plurality of S/H circuits. Each of the plurality of S/H circuits comprises an ADC, a register and a DAC. The ADC receives an input signal and converts the input signal into a digital code. The register, coupled to the ADC, stores the digital code. The DAC, coupled to the register, converts the digital code into an output signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14 is a waveform diagram illustrating the operations of the driver circuit shown in FIG. 13.

DETAILED DESCRIPTION

Figure 1:
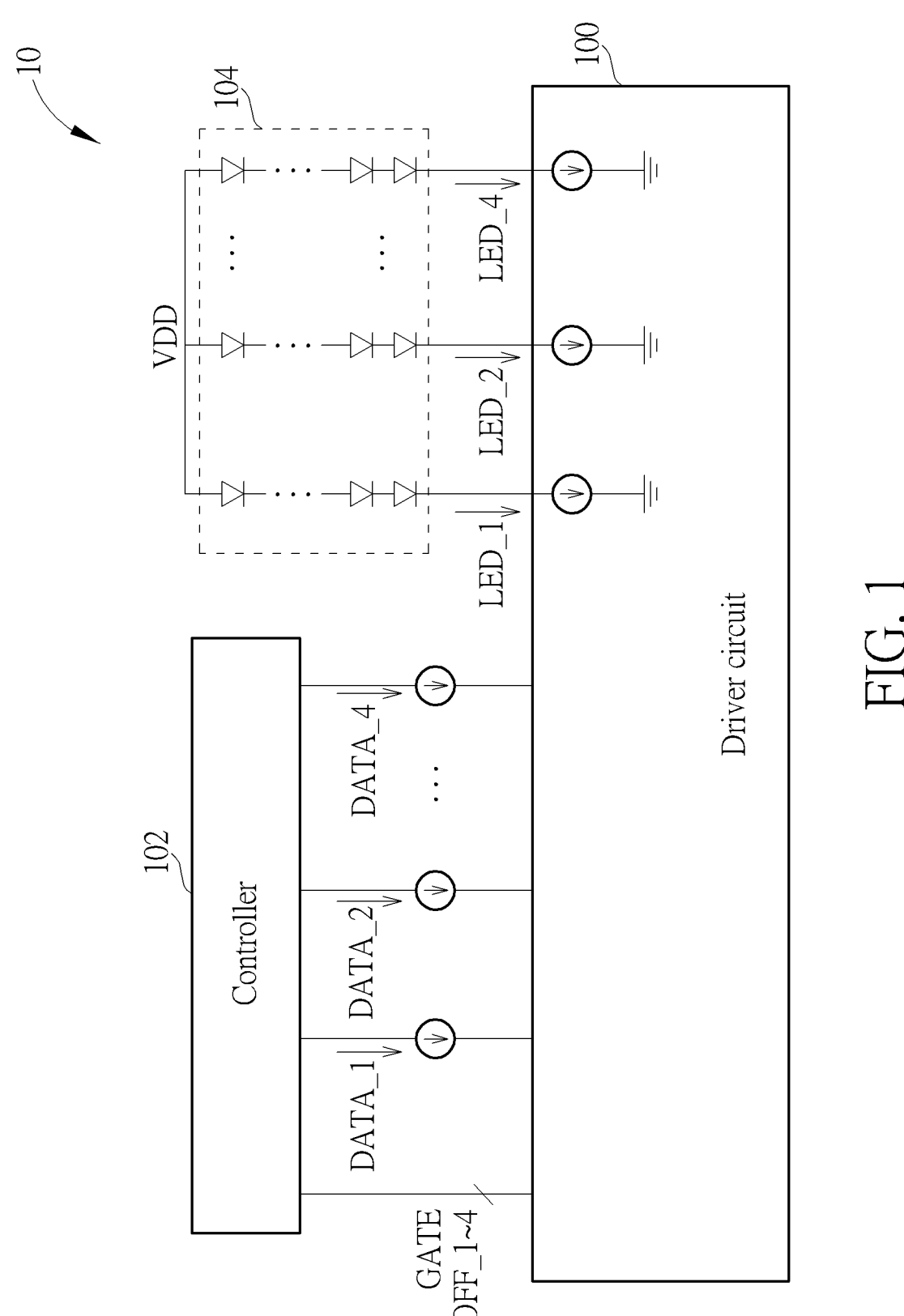
FIG. 1 is a schematic diagram of a display system.

FIG. 1 is a schematic diagram of a display system 10. The display system 10 includes a driver circuit 100, a controller 102 and a display panel 104. The driver circuit 100 may be implemented in an integrated circuit (IC) such as a mini-IC (or called mini driver IC) for driving the display panel 104 to display a video. The controller 102 may be a video provider or a timing controller for generating current data as video data. The display panel 104 may be a light-emitting diode (LED) panel which includes a plurality of LED pixels for generating images by receiving currents from the driver circuit 100 and receiving a power supply voltage VDD. Those skilled in the art should know that the LED panel is merely an example of the display panel 104, and the display panel 104 may be of any type. Note that the display panel 104 may include hundreds or thousands columns of LED pixels, which may be controlled by multiple driver circuits. In this embodiment as shown in FIG. 1, only one driver circuit 100 and 4 columns of LED pixels are illustrated for brevity.

In detail, the driver circuit 100 is capable of driving 4 channels, i.e., 4 columns of LED pixels. The driver circuit 100 may receive input current data DATA_1-DATA_4 from the controller 102. The driver circuit 100 may then amplify the input current data DATA_1-DATA_4 to generate output currents LED_1-LED_4 to be output to the display panel 104. The current output of the display circuit 100 is controlled by control signals such as an IC enable control signal (GATE) and channel off signals (OFF_1-OFF_4), which are also received from the controller 102. The channel off signals OFF_1-OFF_4 control the enabling of the 4 output channels, respectively. In several embodiments, the channel off signals OFF_1-OFF_4 may be replaced by channel enable signals, and similar control schemes may also be feasible. The IC enable control signal GATE controls the enabling of the overall driver circuit 100. For example, when the IC enable control signal GATE equals 0, the outputs of the output currents LED_1-LED_4 are all turned off; and when the IC enable control signal GATE equals 1, the outputs of several output currents LED_1-LED_4 with corresponding channel off signals OFF_1-OFF_4 equal to 0 are turned on, and other output currents LED_1-LED_4 with corresponding channel off signals OFF_1-OFF_4 equal to 1 are turned off.

Figure 2:
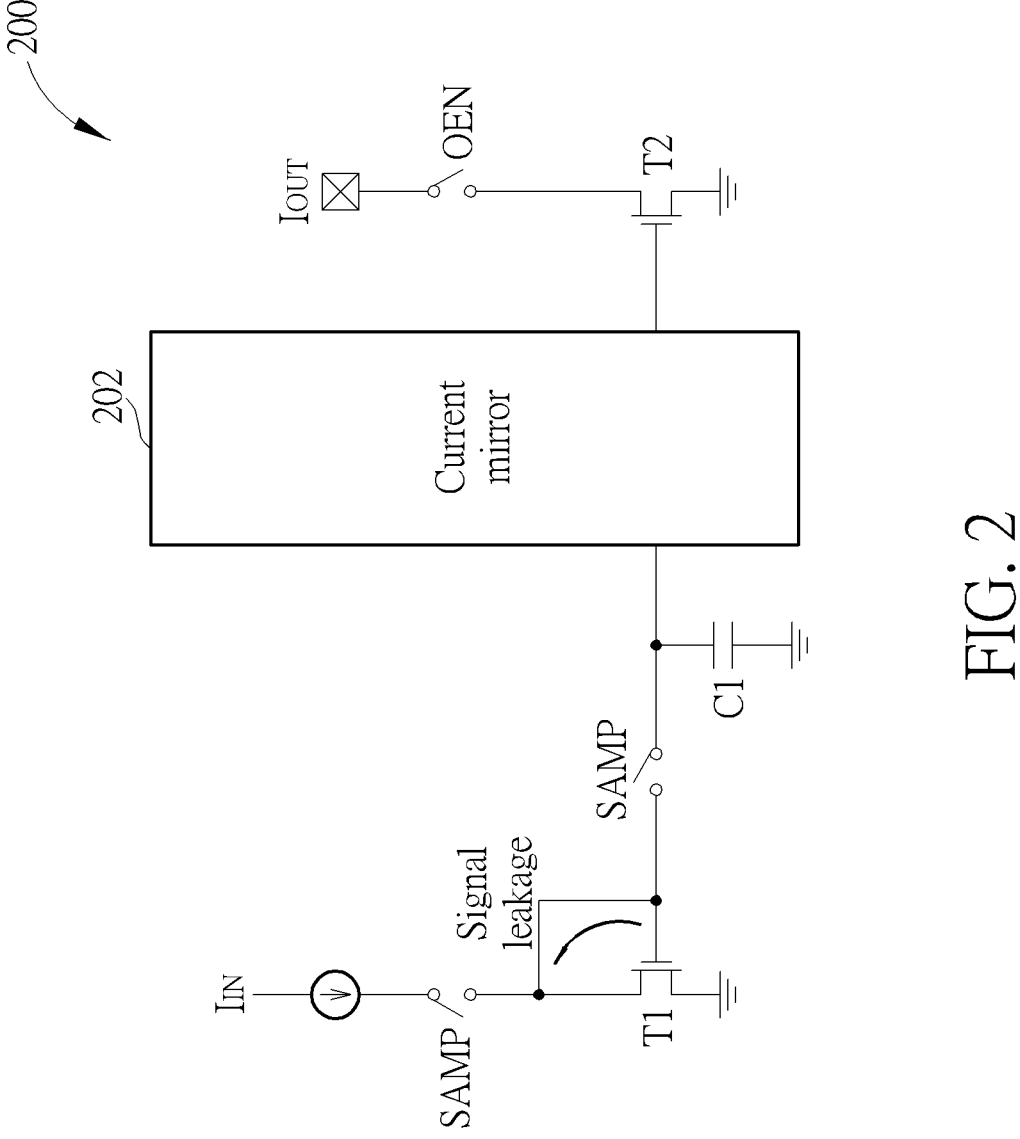
FIG. 2 illustrates a detailed implementation of a channel of a driver circuit.

FIG. 2 illustrates a detailed implementation of a channel of a driver circuit 200, which may amplify an input current $I_{IN}$ to generate an output current $I_{OUT}$. The channel of the driver circuit 200 includes a current mirror 202, a capacitor C1, one or two sampling switches SAMP, an output enable switch OEN, and two transistors T1 and T2. The transistors T1 and T2 may also be regarded as components of the current mirror 202, for duplicating and amplifying the input current $I_{IN}$ to generate the output current $I_{OUT}$, where the size of the transistors T1 and T2 may be used to determine the amplification ratio. The input current $I_{IN}$ may be received and sampled when the sampling switches SAMP are turned on. The capacitor C1 is coupled to the current mirror 202, to store the charges corresponding to the input current $I_{IN}$ to realize the sample and hold functions. The output current $I_{OUT}$ may be output when the output enable switch OEN is turned on.

Figure 3:
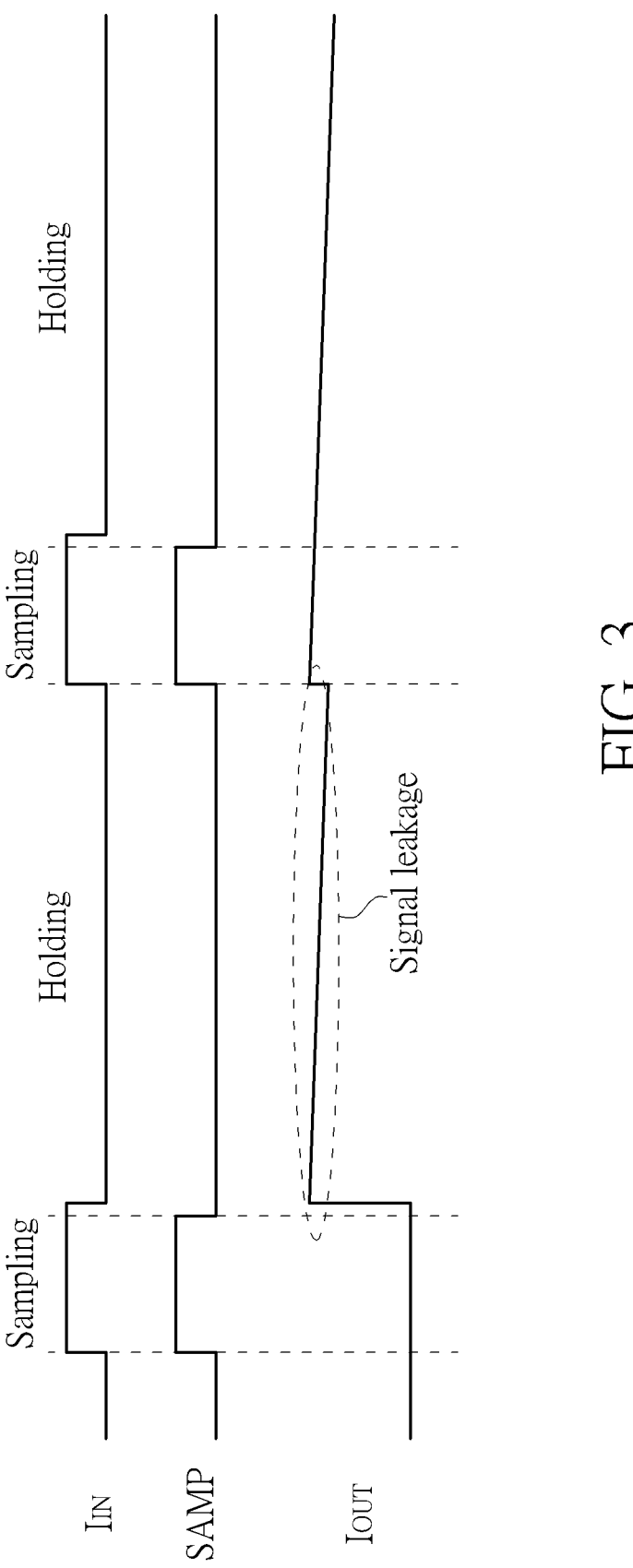
FIG. 3 illustrates the attenuation of output current in the holding period.

However, due to the signal leakage in the circuit devices of the current mirror 202, such as the transistors T1 and T2, the charges stored in the capacitor C1 may decrease gradually during the holding period after the sampling switches SAMP are turned off, such that the output current $I_{OUT}$ may not keep at its accurate value and may generate attenuation. The output attenuation becomes severe when the holding period is longer, as shown in FIG. 3.

In order to solve aforementioned issue, the present invention provides a method of sampling and holding the input current in digital form, where the sampled current may be converted into a digital code to be stored. The stored digital code will not suffer from the problem of signal leakage. Therefore, after the sampling switch is turned off, the output current may still keep at the predetermined level to be output continuously with an unlimited holding period. This facilitates the extension of illumination time in a high brightness application.

Figure 4:
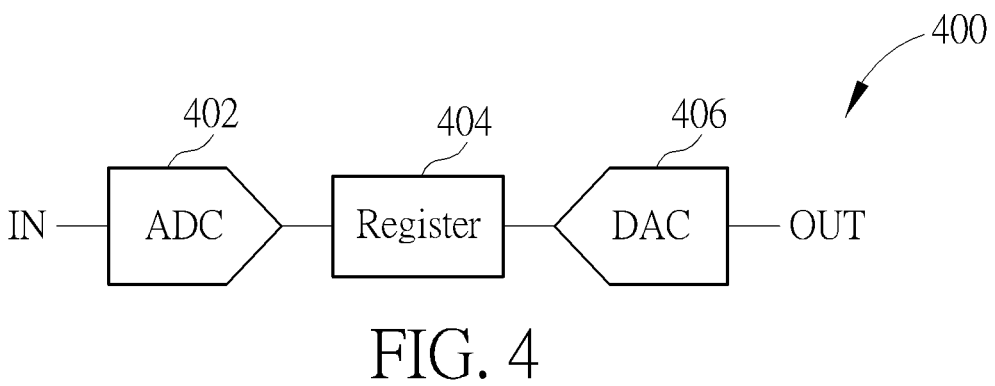
FIG. 4 is a schematic diagram of an S/H circuit according to an embodiment of the present invention.

FIG. 4 is a schematic diagram of a sample and hold (S/H) circuit 400 according to an embodiment of the present invention. The S/H circuit 400 may be included in a driver circuit for driving an LED panel, such as the driver circuit 100 shown in FIG. 1. As shown in FIG. 4, the S/H circuit 400 includes an analog-to-digital converter (ADC) 402, a register 404 and a digital-to-analog converter (DAC) 406. The ADC 402 may receive an input signal IN and convert the input signal IN into one or more digital codes, which is/are stored in the register 404. The register 404 may be implemented by using any circuit device capable of temporarily storing digital data, such as a latch circuit. The DAC 406 may convert the digital code(s) received from the register 404 into an output signal OUT when the display panel needs to receive currents from the driver circuit. The structure of the S/H circuit 400 may be implemented as a channel of the driver circuit that outputs the output signal OUT as an output current to drive one channel of the display panel, e.g., one column among a plurality of columns of LED pixels on the LED panel.

Figure 5:
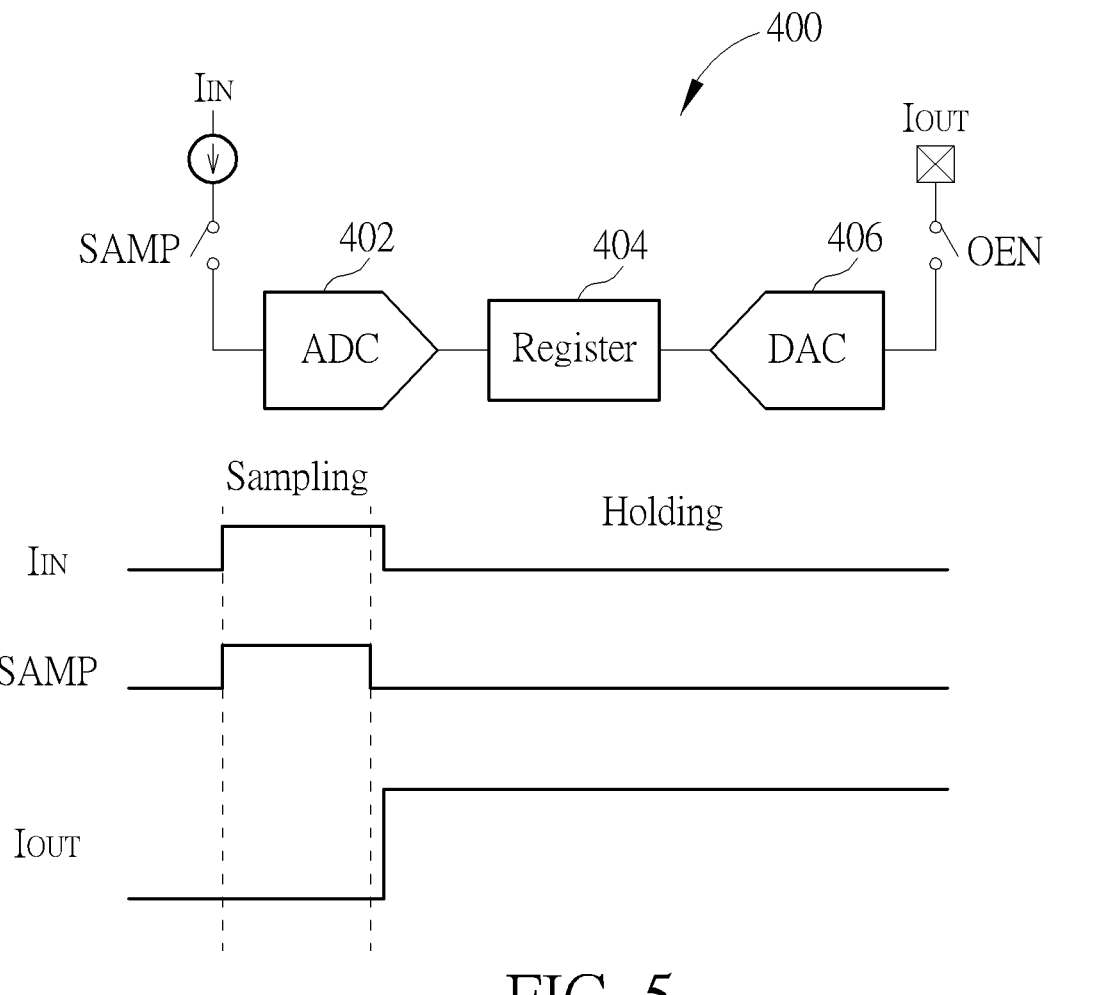
FIG. 5 illustrates an exemplary implementation of the S/H circuit and related waveforms according to an embodiment of the present invention.

FIG. 5 illustrates an exemplary implementation of the S/H circuit 400 and related waveforms according to an embodiment of the present invention. In addition to the ADC 402, the register 404 and the DAC 406, the S/H circuit 400 may further include a sampling switch SAMP and an output enable switch OEN. The ADC 402 may receive an input current $I_{IN}$ when the sampling switch SAMP is turned on, and convert the input current $I_{IN}$ into the digital code. The sampling switch SAMP may be controlled by a control signal generated from any of the channel off signals and the IC enable control signal or their combination. The DAC 406 may output an output current $I_{OUT}$ when the output enable switch OEN is turned on.

In this embodiment, the input signal IN received by the ADC 402 is the input current $I_{IN}$, which may be a current data generated by a controller such as the timing controller or video provider. The output signal OUT output by the DAC 406 is the output current $I_{OUT}$, which may be a current to be provided for an LED pixel of the LED panel. As shown in FIG. 5, during the sampling period, the sampling switch SAMP is turned on (and the output enable switch OEN may be turned off), and the ADC 402 converts the received input current $I_{IN}$ into digital codes, and outputs the digital codes to the register 404 to be stored. Subsequently, during the holding period following the sampling period, the sampling switch SAMP is turned off (and the output enable switch OEN is turned on), and the DAC 406 may output the output current $I_{OUT}$ which is converted from the digital codes. Therefore, the output current $I_{OUT}$ may keep at a constant level without attenuation.

Figure 6:
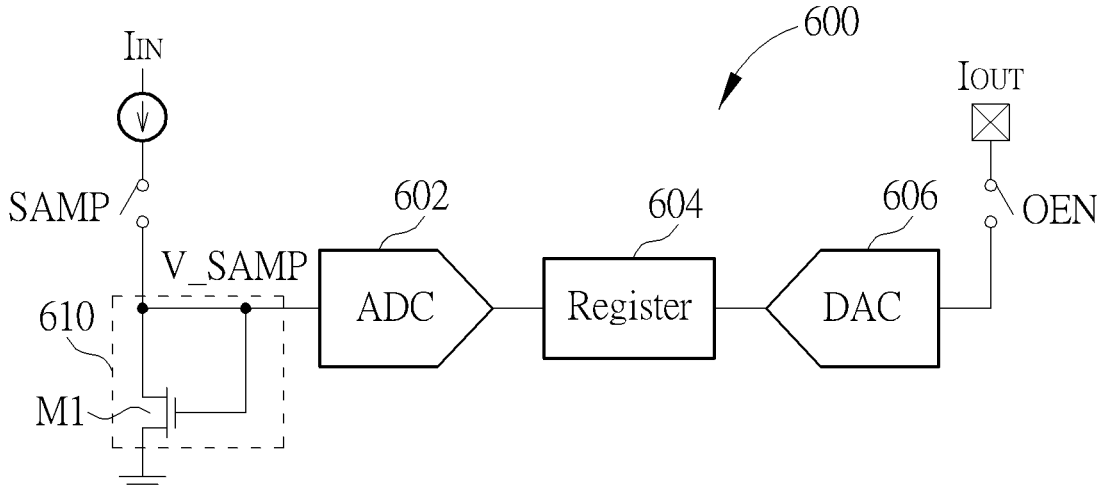
FIG. 6 illustrates another S/H circuit according to an embodiment of the present invention.

FIG. 6 illustrates another S/H circuit 600 according to an embodiment of the present invention. The S/H circuit 600 includes an ADC 602, a register 604, a DAC 606 and a current-to-voltage converter 610. The S/H circuit 600 of FIG. 6 is different from the S/H circuit 400 of FIG. 5 in that, the ADC 402 shown in FIG. 5 is a current ADC, which receives the input current $I_{IN}$ and converts the input current $I_{IN}$ into digital codes, while the ADC 602 of the S/H circuit 600 shown in FIG. 6 is a voltage ADC. In this embodiment, the ADC 602 receives a voltage V_SAMP as the input signal IN, where the current-to-voltage converter 610 of the S/H circuit 600 further converts the input current $I_{IN}$ into the voltage V_SAMP, which is thereby converted into the digital codes by the ADC 602. The current-to-voltage converter 610 includes a transistor M1, which may provide an equivalent resistance for realizing the current-to-voltage conversion. The implementations and operations of the register 604 and the DAC 606 are similar to those of the register 404 and the DAC 406, respectively, and will not be detailed herein.

Figure 7:
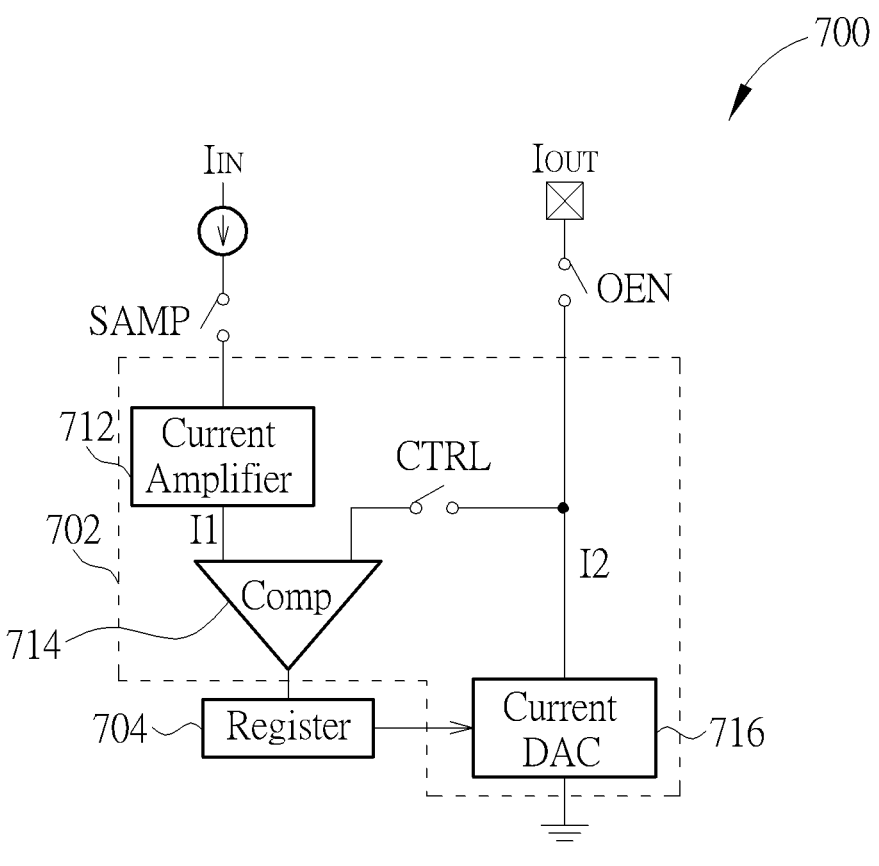
FIG. 7 illustrates another S/H circuit and related waveforms according to an embodiment of the present invention.
Figure 7:
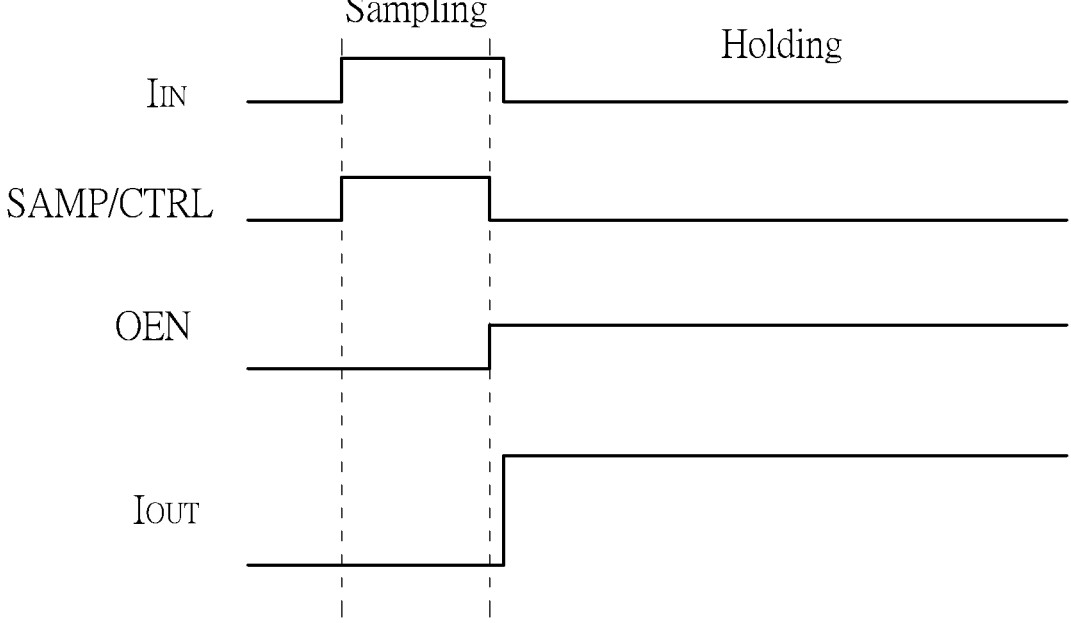

FIG. 7 illustrates another S/H circuit 700 and related waveforms according to an embodiment of the present invention. The S/H circuit 700 includes an ADC 702, a register 704, a sampling switch SAMP and an output enable switch OEN. In detail, the ADC 702 may include a current amplifier 712, a comparator 714, a current DAC 716 and a control switch CTRL. During the sampling period, the sampling switch SAMP is turned on, and the current amplifier 712 may receive and amplify the input current $I_{IN}$ to generate a first current I1. Simultaneously, the output enable switch OEN is turned off and the control switch CTRL is turned on, and thus the first current I1 may be compared with a reference current I2 generated by the current DAC 716. In other words, the comparator 714 may compare the first current I1 with the reference current I2, and the comparison results are output as a series of digital codes to be stored in the register 704. Based on the comparison results, the value of the reference current I2 may be adjusted to approach the first current I1, to sequentially determine each bit of the digital codes.

Subsequently, during the holding period, the sampling switch SAMP is turned off, the control switch CTRL is turned off, and the output enable switch OEN is turned on. Therefore, the current corresponding to the stored digital codes may be output by the current DAC 716, as the output current $I_{OUT}$ to the LED panel.

Different from the embodiment shown in FIG. 4 where the ADC 402 and the DAC 406 are two independent circuit devices, in the embodiment shown in FIG. 7, the ADC may include a DAC; that is, the current DAC 716 is a component of the ADC 702 in the S/H circuit 700. Therefore, during the sampling period, the current DAC 716 included in the ADC 702 may help the ADC 702 realize the conversion of input current data; and during the holding period, the current DAC 716 may generate the output current $I_{OUT}$ based on the stored digital codes. In such a situation, the DAC included in the ADC may realize the current conversion functions as the current DAC 716 shown in FIG. 7; hence, the DAC may perform the analog-to-digital conversion of the ADC and also perform the digital-to-analog conversion of the current DAC. The efficient usage of DAC allows the circuit structure to be simplified and the circuit costs to be saved.

Figure 8:
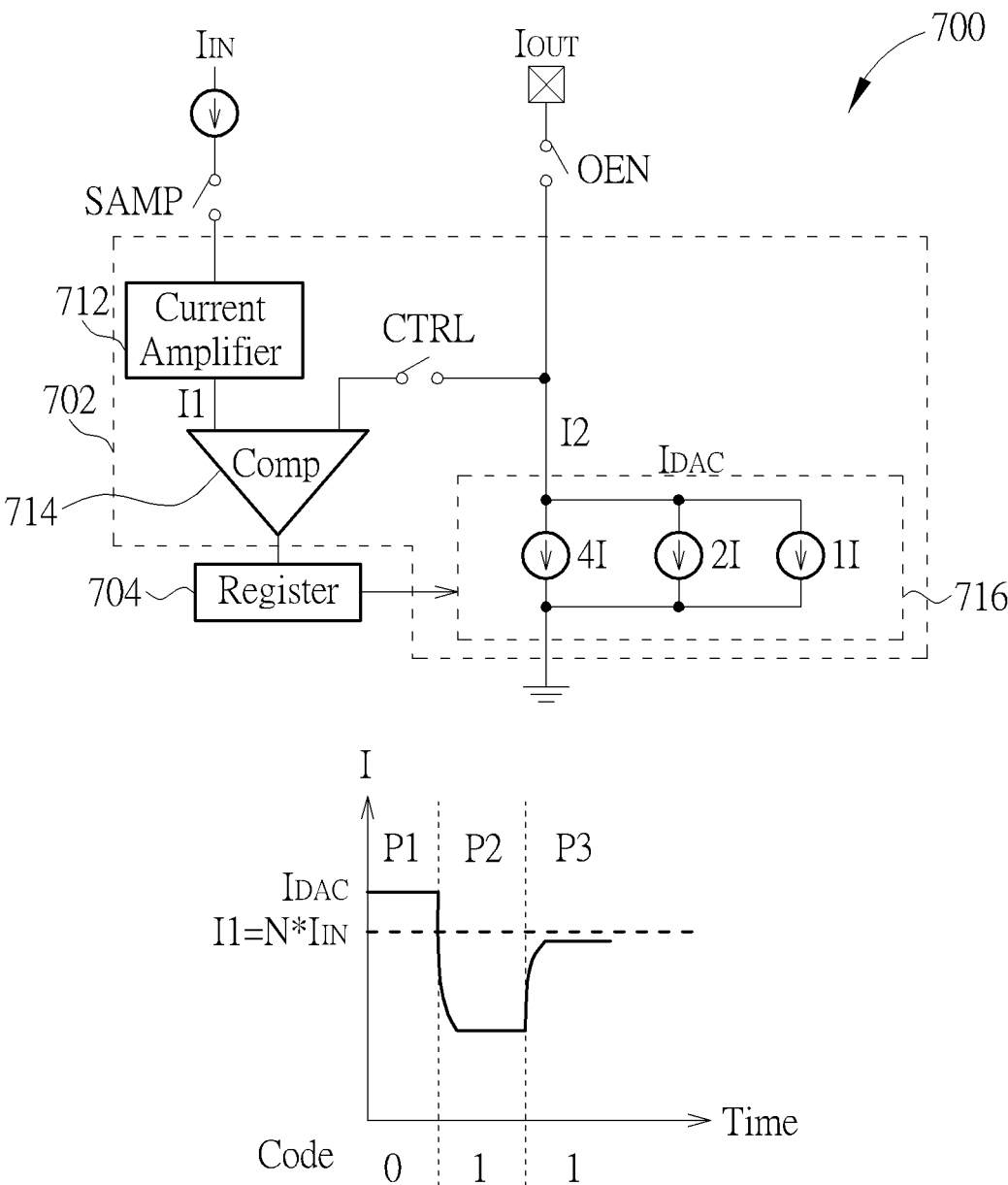
FIG. 8 illustrates a detailed implementation and operation of the S/H circuit shown in FIG. 7.

FIG. 8 illustrates a detailed implementation and operation of the S/H circuit 700 shown in FIG. 7. More specifically, FIG. 8 shows the detailed structure of the current DAC 716, which includes three current sources deployed with different current values 4I, 2I and 1I, respectively. During the sampling period, the sampling switch SAMP and the control switch CTRL are turned on and the output enable switch OEN is turned off. The current DAC 716 may output a DAC current $I_{DAC}$ as the reference current I2 to be compared with the first current I1. The first current I1 is amplified from the input current $I_{IN}$, and may be equal to N times the input current $I_{IN}$, where N is the amplification ratio of the current amplifier 712.

In this embodiment, the current DAC 716 may have 3-bit resolution, where the value of the DAC current $I_{DAC}$ ranges from 0 to 7I according to selection of the current sources in the current DAC 716. In such a situation, the sampling operations may be performed in three phases P1-P3. In the first phase P1, the DAC current $I_{DAC}$ equals 4I by selectively turning on the current source of 4I, and the comparator 714 compares the first current I1 with the DAC current $I_{DAC}$, to determine that the first current I1 is smaller than the DAC current $I_{DAC}$. Therefore, the most significant bit (MSB) is determined to be 0. In the second phase P2, the DAC current $I_{DAC}$ equals 2I by selectively turning on the current source of 2I, where the current source of 4I is turned off since the MSB is 0, and the comparator 714 compares the first current I1 with the DAC current $I_{DAC}$, to determine that the first current I1 is greater than the DAC current $I_{DAC}$. Therefore, the second bit is determined to be 1. In the third phase P3, the DAC current $I_{DAC}$ equals 3I by selectively turning on the current source of I, where the current source of 2I is still turned on since the second bit is 1, and the comparator 714 compares the first current I1 with the DAC current $I_{DAC}$, to determine that the first current I1 is greater than the DAC current $I_{DAC}$. Therefore, the third bit (i.e., the least significant bit (LSB)) is determined to be 1. The determined digital code "011" will be recorded and stored in the register 704.

Afterwards, in the holding period where the output current $I_{OUT}$ needs to be output to the LED panel, the sampling switch SAMP and the control switch CTRL are turned off and the output enable switch OEN is turned on. The current DAC 716 thereby generates the output current $I_{OUT}$ according to the digital code 011. Therefore, the output current $I_{OUT}$ approximately equal to the amplified input current $I_{IN}$ may be generated and output.

Figure 9A:
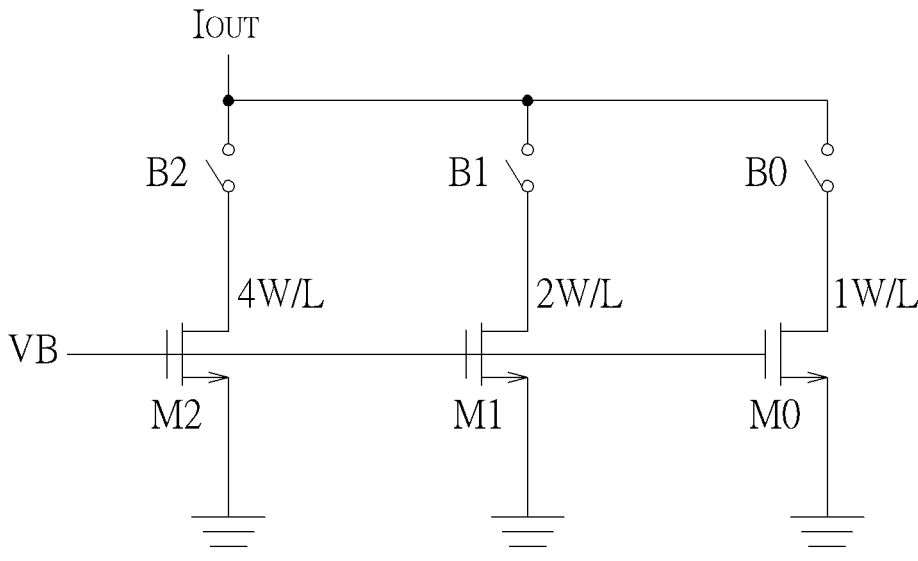
FIGS. 9A and 9B illustrate detailed implementations of the current DAC.
Figure 9B:
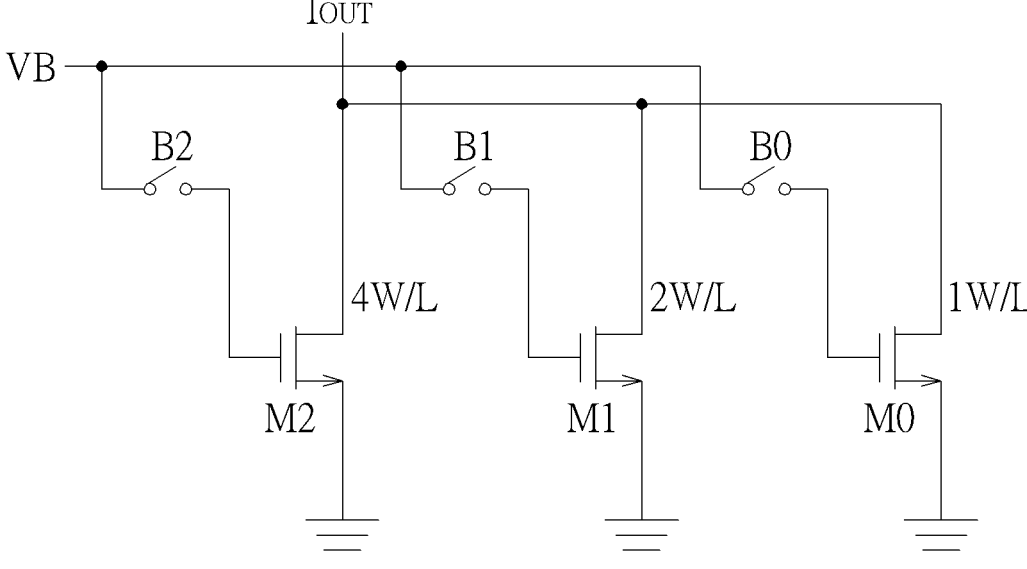

The current sources in the current DAC 716 may be implemented in various manners. In some embodiments, each current source may be implemented by using a transistor. For example, FIGS. 9A and 9B illustrate detailed implementations of the current DAC 716. The current DAC 716 may include transistors M2, M1 and M0 to realize 3 current sources, and the transistors M2, M1 and M0 are coupled to control switches B2, B1 and B0, respectively. In these embodiments, the transistors M2, M1 and M0 may receive the same bias voltage VB, and have different width-length ratios (i.e., 4 W/L, 2 W/L and 1 W/L) to be adapted to realize the current sources having different current values (i.e., 4I, 2I and 1I).

Each transistor M2, M1 or M0 is coupled to the corresponding control switch B2, B1 or B0, where the control switches B2-B0 may be coupled to the drain terminal of the corresponding transistors M2-M0 as shown in FIG. 9A, or coupled to the gate terminal of the corresponding transistors M2-M0 as shown in FIG. 9B.

The control switches B2-B0 are controlled to determine the value of the current magnitude output by the current DAC 716. For example, during the holding period where the output current $I_{OUT}$ is requested to be output to the LED panel, the digital codes (e.g., "011") stored in the register 704 is converted into control signals to control the on/off statuses of the control switches B2-B0, so as to generate the desired current value.

Figure 10:
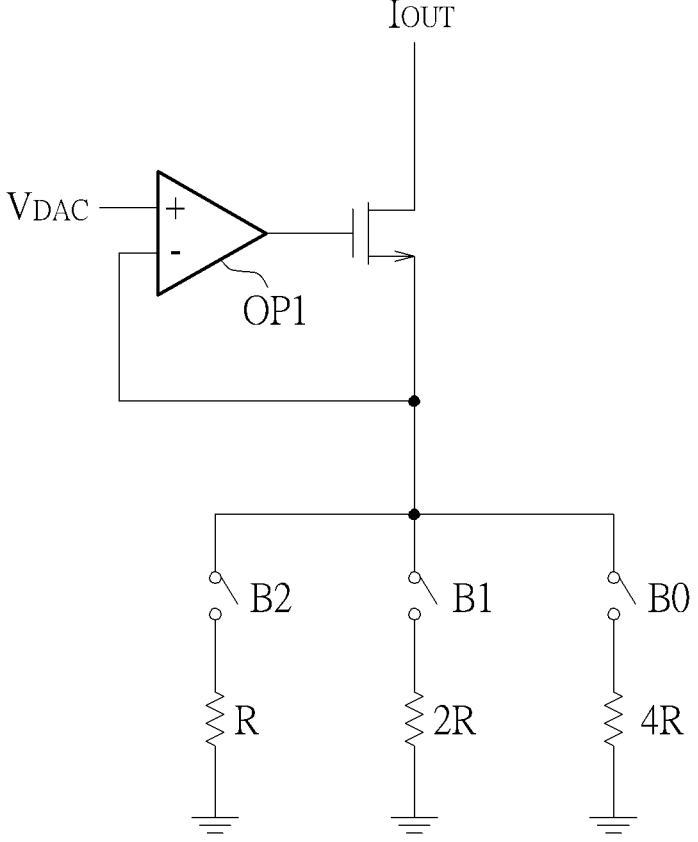
FIG. 10 illustrates a detailed implementation of the current DAC in which the current source is implemented by using one or more resistors.

In other embodiments, each current source in the current DAC 716 may be implemented by using one or more resistors, as shown in FIG. 10. In the embodiment, the current DAC 716 includes control switches B2-B0 connected to several resistors having different values such as R, 2R and/or 4R, and also includes an operational amplifier OP1. A current DAC voltage $V_{DAC}$ may be received by the operational amplifier OP1 through its positive input terminal. The desired output current $I_{OUT}$ can be determined by the connections of the control switches B2-B0 along with the resistors. The relation between $I_{OUT}$ and $V_{DAC}$ will be $I_{OUT}=V_{DAC}/R'$ where R' is the total resistance connected.

Please note that the above embodiments apply 3-bit resolution in the ADC and DAC to facilitate the illustrations. In order to increase the accuracy of the output current $I_{OUT}$ (i.e., to allow the output current $I_{OUT}$ to be more approximate to a desired value such as the amplified input current $I_{IN}$), the ADC/DAC having a higher resolution may be applied.

Figure 11:
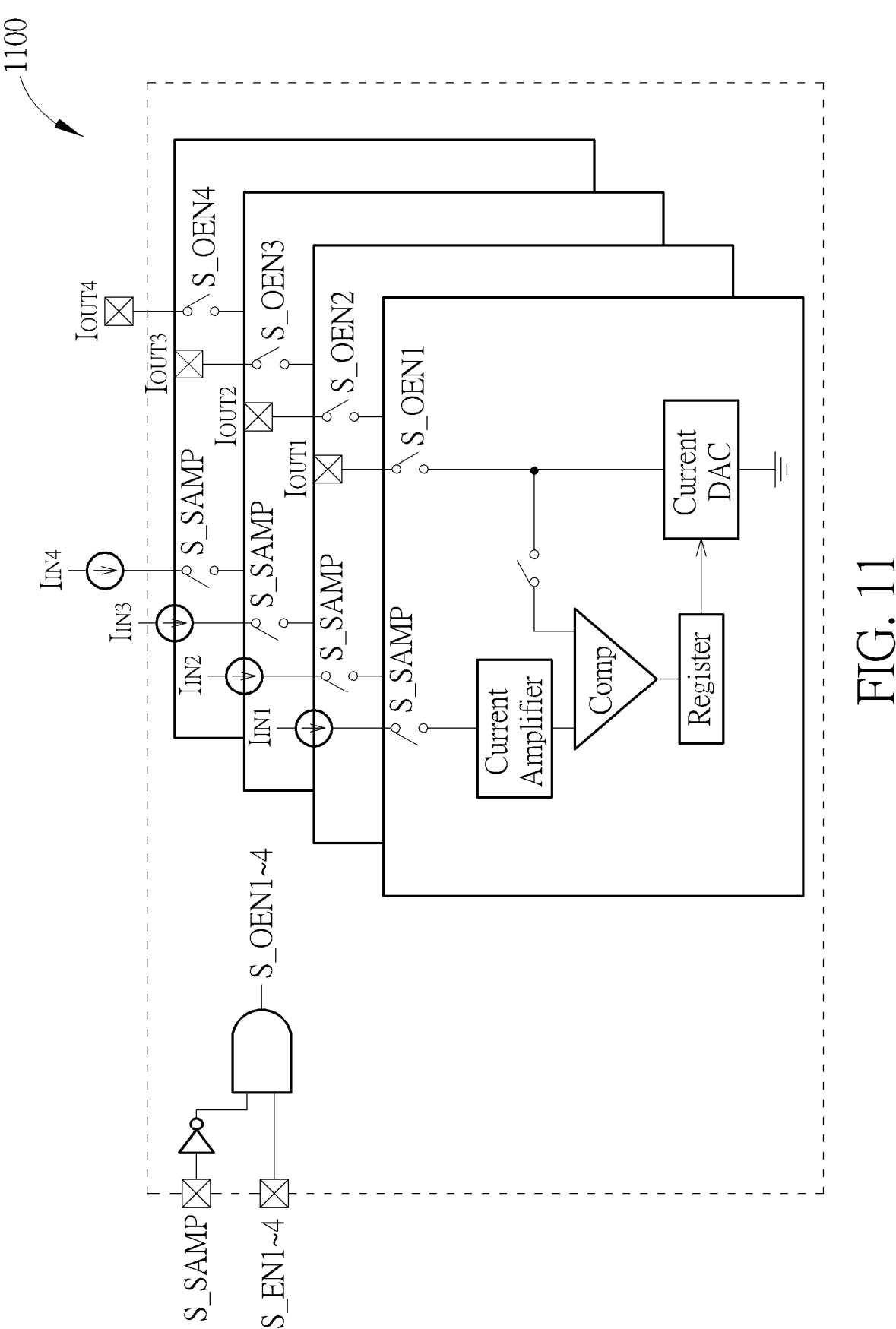
FIG. 11 is a schematic diagram of a driver circuit according to an embodiment of the present invention.

FIG. 11 is a schematic diagram of a driver circuit 1100 according to an embodiment of the present invention. The driver circuit 1100 may be a mini-IC responsible to drive 4 channels (e.g., 4 columns of LED pixels) of an LED panel. More specifically, the driver circuit 1100 may receive 4 input currents $I_{IN1}$-$I_{IN4}$, and correspondingly output 4 output currents $I_{OUT1}$-$I_{OUT4}$ based on the controls of 4 channel enable signals S_EN1-S_EN4 and a sampling control signal S_SAMP. The channel enable signals S_EN1-S_EN4 control the enabling of 4 output channels, respectively, and the functions of the channel enable signals S_EN1-S_EN4 are similar to those of the channel off signals as described above. The sampling control signal S_SAMP controls the sample and hold operations of the overall driver circuit. Therefore, the channel enable signals S_EN1-S_EN4 and the sampling control signal S_SAMP may commonly control the operations of each S/H circuit, e.g., by using a logic circuit consisting of appropriate logic gates, as shown in FIG. 11.

In detail, the driver circuit 1100 includes 4 S/H circuits, each of which receives the corresponding input current $I_{IN1}$-$I_{IN4}$ from the respective input pin according to the control of the sampling control signal S_SAMP in the sampling period. For example, a first S/H circuit may receive the input current $I_{IN1}$ from a first input pin according to the sampling control signal S_SAMP, a second S/H circuit may receive the input current $I_{IN2}$ from a second input pin according to the sampling control signal S_SAMP, and so on. The 4 S/H circuits may then output the output current $I_{OUT1}$-$I_{OUT4}$ to the corresponding channel of the LED panel according to the control of the respective output enable switch. The S/H circuits then output the corresponding output currents $I_{OUT1}$-$I_{OUT4}$ in the holding period. As shown in FIG. 11, each S/H circuit may have a structure similar to the S/H circuit 700 shown in FIG. 7, but not limited thereto.

Figure 12:
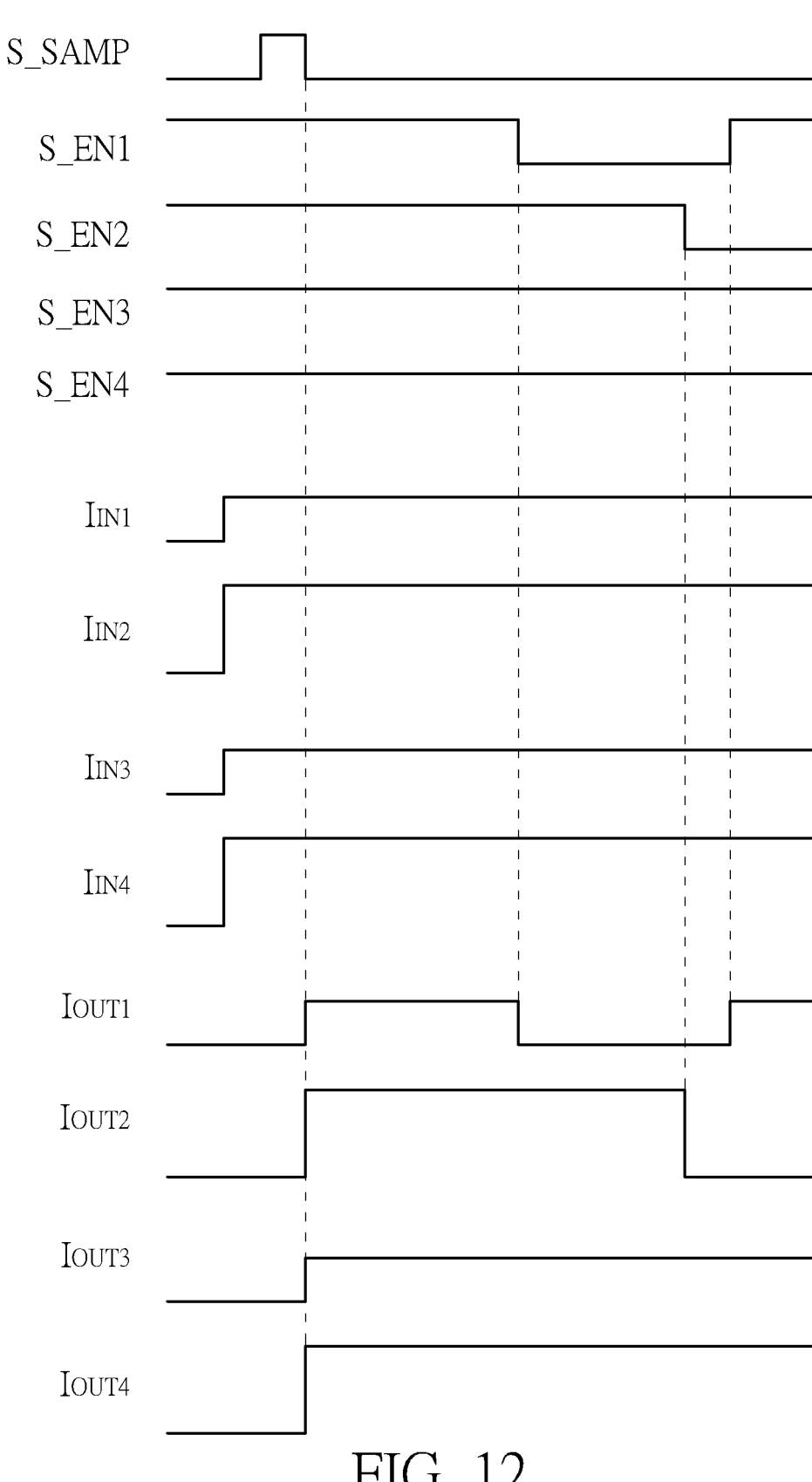
FIG. 12 is a waveform diagram illustrating the operations of the driver circuit shown in FIG. 11.

FIG. 12 is a waveform diagram illustrating the operations of the driver circuit 1100, where waveforms of the input currents $I_{IN1}$-$I_{IN4}$, the output currents $I_{OUT1}$-$I_{OUT4}$, the channel enable signals S_EN1-S_EN4 and the sampling control signal S_SAMP are illustrated. As mentioned above, the sampling control signal S_SAMP controls the sample and hold operations of the driver circuit 1100. When the sampling control signal S_SAMP goes high, the driver circuit 1100 is in a sampling period, and the input currents $I_{IN1}$-$I_{IN4}$ are sampled and converted into the digital codes to be stored in the register. When the sampling control signal S_SAMP goes low, the driver circuit 1100 is in a holding period, and the digital codes are converted into the output currents $I_{OUT1}$-$I_{OUT4}$ to be output based on the controls of the respective channel enable signals S_EN1-S_EN4. As shown in FIG. 12, each of the output currents $I_{OUT1}$-$I_{OUT4}$ is output when the sampling control signal S_SAMP is low and the corresponding channel enable signal S_EN1-S_EN4 is high, and the levels of the output currents $I_{OUT1}$-$I_{OUT4}$ correspond to the levels of the input currents $I_{IN1}$-$I_{IN4}$ respectively.

Note that the sampling switch and the output enable switch in each S/H circuit may be controlled by using the sampling control signal S_SAMP and the channel enable signal S_EN1-S_EN4 through appropriate logic circuits. An example is shown in FIG. 11, where the sampling switch in each S/H circuit may be directly controlled by the sampling control signal S_SAMP, and the output enable switch in the S/H circuits may be controlled by output enable signals S_OEN1-S_OEN4, respectively. Each of the output enable signals S_OEN1-S_OEN4 may be generated by combining the sampling control signal S_SAMP with the respective channel enable signal S_EN1-S_EN4 through an inverter and an AND gate.

In the conventional mini-IC, the holding period cannot be too long due to attenuation of the output current caused by signal leakage, as shown in FIG. 3. However, in the embodiments of the present invention, the output current is converted from the digital code stored in the register, and will not suffer from the signal leakage problem. In general, the sampling operation of converting the input current into a digital code can be completed rapidly, and thus the sampling operation only requires a short time; hence, the holding period may be set to be quite long. In such a situation, if a longer illumination time is required, the current output period may be as long as possible without current attenuation until the next input current data arrives.

In another embodiment, the input current data for multiple output channels may be provided from the same input pin, so that the pin count of the driver circuit may further be reduced. For example, in an embodiment where the driver circuit provides currents for 4 channels of the LED panel as shown in FIG. 11, the total number of I/O pins and control pins is 13 (i.e., including 4 input pins, 4 output pins, 4 channel enable pins, and 1 sampling control pin), which is the same as the conventional mini-IC. In another embodiment, the driver circuit may include only one input pin, which receives input data for generating the output currents of multiple output channels. In such a situation, the pin count may be reduced and the circuit costs may further be saved.

Figure 13:
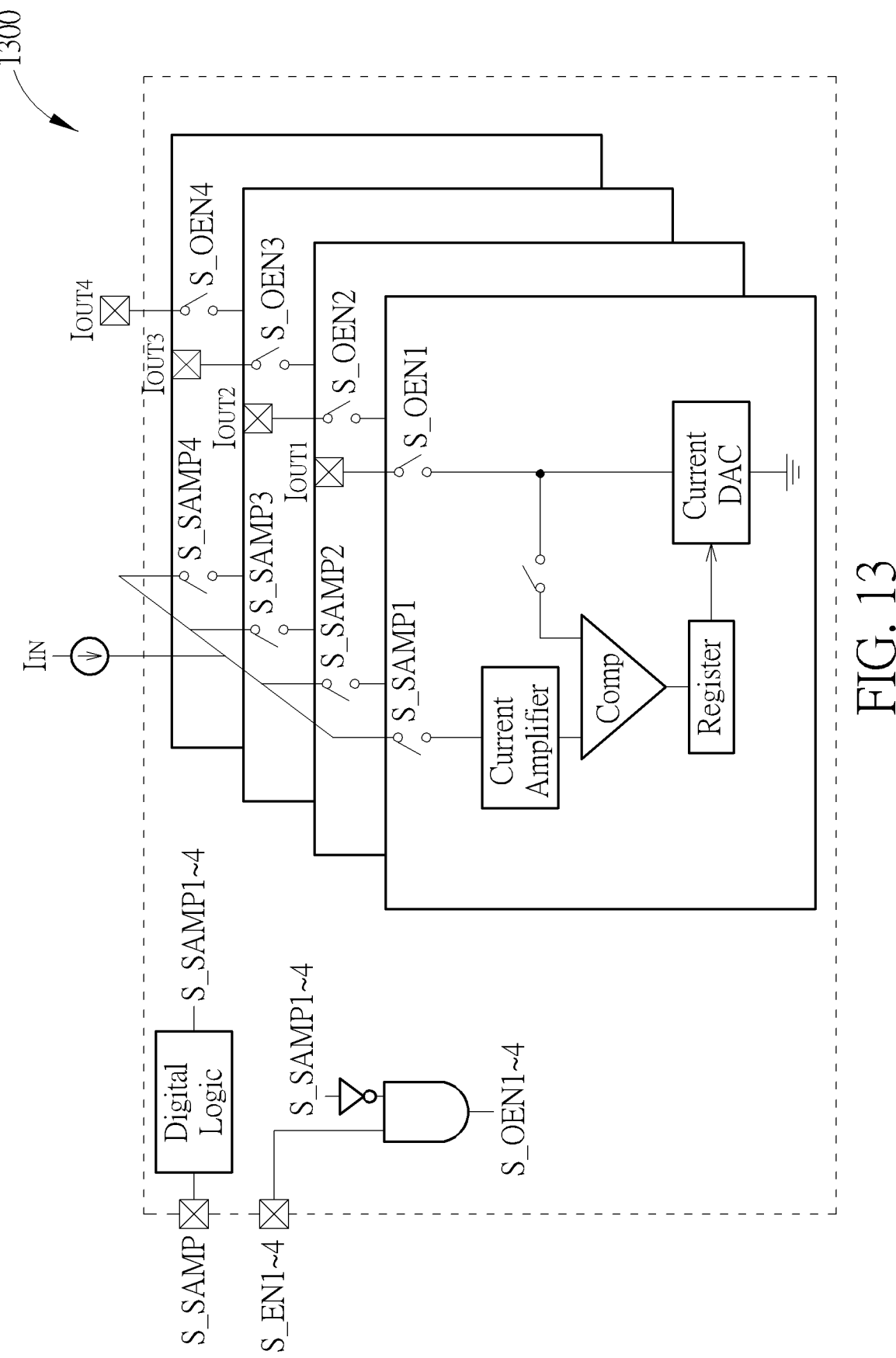
FIG. 13 is a schematic diagram of another driver circuit according to an embodiment of the present invention.

FIG. 13 is a schematic diagram of another driver circuit 1300 according to an embodiment of the present invention, where the driver circuit 1300 includes only 1 input pin for 4 S/H circuits and 4 output channels. The circuit structure of the driver circuit 1300 is similar to the circuit structure of the driver circuit 1100 shown in FIG. 11, so signals and elements having similar functions are denoted by the same symbols. The difference between the driver circuit 1300 and the driver circuit 1100 is that, in the driver circuit 1300, the input pin is coupled to the S/H circuits in 4 different channels. Therefore, the input currents $I_{IN1}$-$I_{IN4}$ for the 4 S/H circuits may be sampled from the same input pin time-divisionally, to generate the digital codes for different output channels to be stored into the corresponding registers in different time periods.

Figure 14:
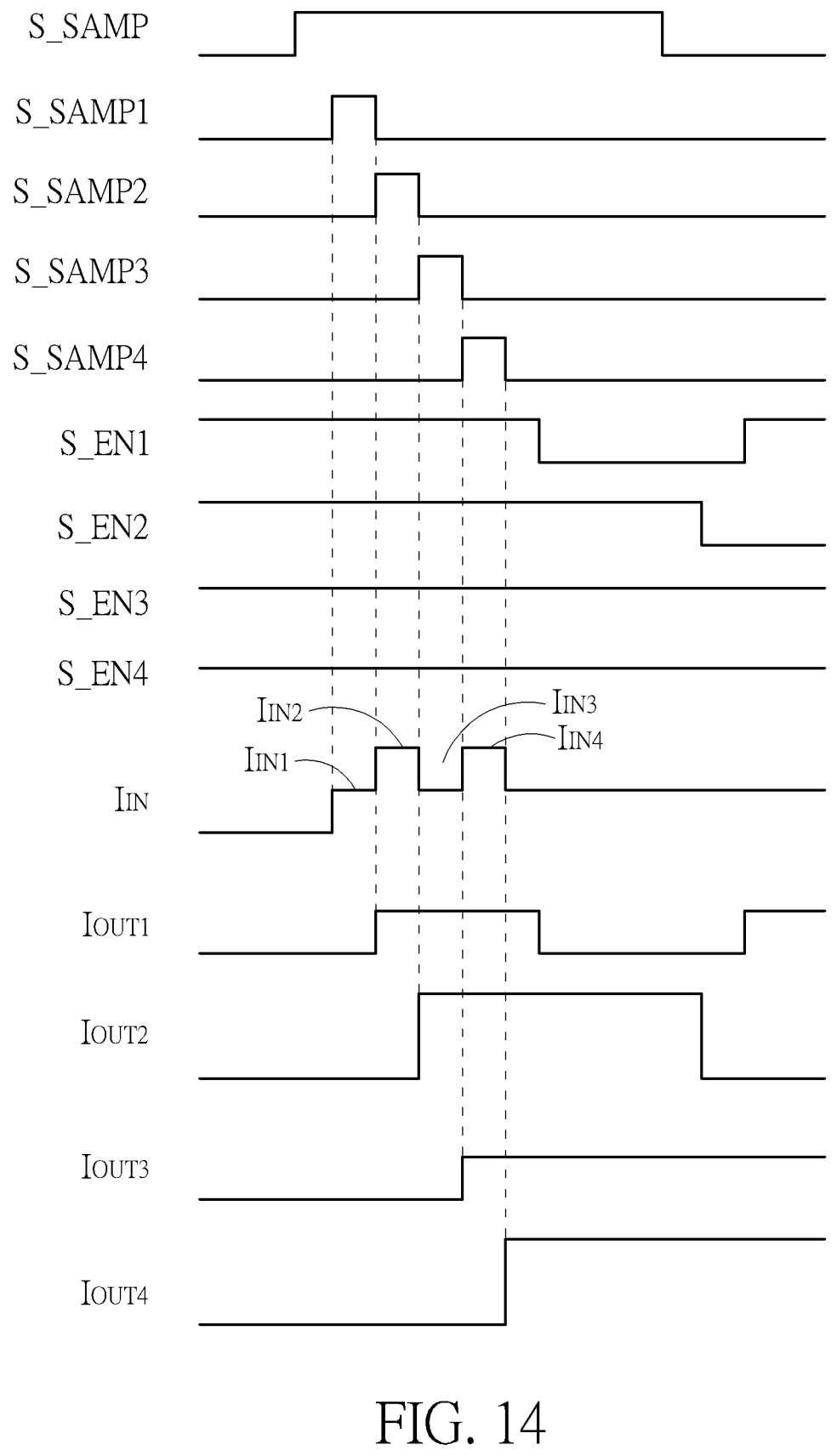

FIG. 14 is a waveform diagram illustrating the operations of the driver circuit 1300, where waveforms of the input current $I_{IN}$, the output currents $I_{OUT1}$-$I_{OUT4}$, the channel enable signals S_EN1-S_EN4 and the sampling control signal S_SAMP are illustrated. The sampling control signals S_SAMP1-S_SAMP4 for the sampling switches in different channels, as may be generated from the input sampling control signal S_SAMP, are also illustrated. Therefore, different S/H circuits in the driver circuit 1300 may receive respective input currents from the same input pin according to the control of different sampling control signals S_SAMP1-S_SAMP4.

As shown in FIG. 14, during a period where the input sampling control signal S_SAMP is high, the sampling switches of 4 S/H circuits are turned on sequentially and time-divisionally through the sampling control signals S_SAMP1-S_SAMP4. Correspondingly, the input currents $I_{IN1}$-$I_{IN4}$ for the 4 S/H circuits are received and sampled when the corresponding sampling switches are turned on.

Similarly, the sampling control signals S_SAMP1-S_SAMP4 for different sampling switches and the output enable signals S_OEN1-S_OEN4 for different output enable switches in the S/H circuits may be generated by using the input sampling control signal S_SAMP and the channel enable signal S_EN1-S_EN4 through appropriate logic circuits. For example, as shown in FIG. 13, the sampling control signals S_SAMP1-S_SAMP4 are generated from the input sampling control signal S_SAMP through a digital logic circuit, which may introduce different delays to make the sampling control signals S_SAMP1-S_SAMP4 provide different sampling times, allowing the S/H circuits to sample time-divisionally. Each of the output enable signals S_OEN1-S_OEN4 may be generated by combining the respective sampling control signal S_SAMP1-S_SAMP4 with the respective channel enable signal S_EN1-S_EN4 through an inverter and an AND gate.

In this embodiment, each output current $I_{OUT1}$-$I_{OUT4}$ may be output right after the corresponding input current $I_{IN1}$-$I_{IN4}$ is sampled and the corresponding sampling switch is turned off. For example, as shown in FIGS. 13 and 14, as for the first S/H circuit, the output current $I_{OUT1}$ is output when the output enable signal S_OEN1 turns on the corresponding output control switch, and this turned-on switch is achieved when the sampling control signal S_SAMP1 is low and the channel enable signal S_EN1 is high. That is, the output current $I_{OUT1}$ may be output regardless of whether the input current data for other channels are completely sampled. In such a situation, if a longer illumination time is required, the current output period may still be as long as possible without current attenuation and without being influenced by other channels until the next input current data for the same S/H circuit arrives.

Therefore, in this embodiment, the total number of I/O pins and control pins is 10 (i.e., including 1 input pin, 4 output pins, 4 channel enable pins, and 1 sampling control pin), which may achieve an improvement of pin counts and circuit costs as compared to the previous embodiment. Based on well communications and negotiations with the front-end controller, the driver circuit 1300 may receive the input current data for different output channels through the same input pin time-divisionally. Note that the implementation of 4 output channels in the above embodiments is merely an example serving to illustrate a possible structure of the driver circuit. In fact, the driver circuit may provide the output currents through any number of output channels for driving any columns of LED pixels, and one input data pin may provide current data for any number of output channels; these are not limited herein.

To sum up, the present invention provides a driver circuit, such as a mini-IC, which drives an LED panel and provides currents for LED pixels. Each channel of the driver circuit may include an S/H circuit, which includes an ADC, a register and a DAC. The input current data may be sampled and converted into one or more digital codes by the ADC, where the digital code(s) may be stored in the register. During the current output period where an output current needs to be provided for the LED panel to generate illumination, the digital code(s) may be converted into the output current. This implementation can provide a longer current output period without signal attenuation since the information of current data is stored in the digital form. The accuracy of the output current hence may further be improved by using an ADC and/or DAC having a higher resolution. In an embodiment, an input pin may receive input current data used for multiple output channels, and the input currents for different output channels may be sampled time-divisionally, to generate the digital codes for different output channels, respectively. In such a situation, the pin count of the driver circuit may be reduced, so as to save the circuit costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sample and hold (S/H) circuit, comprising:
an analog-to-digital converter (ADC), to receive an input signal and convert the input signal into a digital code;
a register, coupled to the ADC, to store the digital code;
a digital-to-analog converter (DAC), coupled to the register, to convert the digital code into an output signal; and
a current-to-voltage converter, coupled between the ADC and an input terminal of the S/H circuit, to convert an input current of the S/H circuit into a voltage to serve as the input signal;
wherein the current-to-voltage converter comprises a transistor, of which a gate terminal and a drain terminal are coupled to each other and further coupled to an input terminal of the ADC.

2. The S/H circuit of claim 1, wherein the ADC converts the input signal into the digital code in a sampling period, and the DAC converts the digital code into the output signal in a holding period following the sampling period.

3. The S/H circuit of claim 1, wherein the register comprises a latch circuit.

4. The S/H circuit of claim 1, wherein the output signal is an output current.

5. The S/H circuit of claim 1, further comprising:
a sampling switch, coupled to the ADC, to be turned on in a sampling period; and
an output enable switch, coupled to the DAC, to be turned on in a holding period following the sampling period.

6. The S/H circuit of claim 1, wherein the DAC comprises:
a plurality of control switches, each controlled according to the digital code; and
a plurality of current sources, each coupled to one of the plurality of control switches.

7. The S/H circuit of claim 1, wherein the DAC comprises:
a plurality of control switches, each coupled to a first node or a second node according to the digital code;
a plurality of resistors, each coupled to one of the plurality of control switches, to generate an output voltage; and
an operational amplifier, coupled to the plurality of resistors, to generate an output current according to the output voltage.

8. The S/H circuit of claim 1, wherein the S/H circuit outputs the output signal as an output current to one of a plurality of channels of a light-emitting diode (LED) panel.

* * * * *